(12) United States Patent
Datesman

(10) Patent No.: US 12,046,809 B1
(45) Date of Patent: Jul. 23, 2024

(54) POWER ELECTRONICS USING SUPERCONDUCTIVE VORTEX VALVE SWITCHES

(71) Applicant: Aaron Datesman, Washington, DC (US)

(72) Inventor: Aaron Datesman, Washington, DC (US)

(*) Notice: Subject to any disclaimer, the term of this patent is extended or adjusted under 35 U.S.C. 154(b) by 193 days.

(21) Appl. No.: 17/938,005

(22) Filed: Oct. 4, 2022

(51) Int. Cl.
*H01Q 1/38* (2006.01)
*H01B 12/02* (2006.01)

(52) U.S. Cl.
CPC .............. *H01Q 1/38* (2013.01); *H01B 12/02* (2013.01)

(58) Field of Classification Search
CPC .. H01Q 1/38; H01B 12/02; H01F 6/04; G01R 33/3804; G01R 33/3815; F25B 9/14; F25B 21/00; Y10T 29/49002; Y10T 29/49014; G11C 11/44
See application file for complete search history.

(56) References Cited

U.S. PATENT DOCUMENTS

| | | | |
|---|---|---|---|
| 3,538,457 A | 9/1968 | Hanrahan | ................ H03K 3/38 |
| 5,472,935 A * | 12/1995 | Yandrofski | ............. H01P 7/084 |
| | | | 505/700 |

OTHER PUBLICATIONS

Barton et al., "Superconducting AC/DC Power Conversion using High-Temperature Superconducting Components", IEEE Transactions on Applied Superconductivity, vol. 9, No. 2, Jun. 1999, pp. 685-688.
Buck, "The Cryotron—A Superconductive Computer Component", Proceedings of the IRE, Nov. 10, 1955, pp. 482-493.
Buck, "The Cryotron—A Superconductive Computer Component", Memorandum 6M-3843, Div. 6, Lincoln Laboratory, M.I.T., Lexington, Massachusetts, Aug. 1955, 32 pgs.
Cunningham, et al., "Low Noise Switching of a Superconducting Circuit by a Laser Induced Weak Link", IEEE Transactions on Magnetics, vol. 25, No. 2, Mar. 1989, pp. 1022-1025.
Gupta, et al., "On Possibility of Using High-$T_c$ Ceramic-Superconductor as Junction-less Transistor towards Nano-miniaturization", arXiv: General Physics (2005), pp. 1-7.

(Continued)

*Primary Examiner* — David E Lotter
(74) *Attorney, Agent, or Firm* — HAYES SOLOWAY P.C.

(57) ABSTRACT

A superconductive vortex valve apparatus and related methods of operation are disclosed. A superconductive vortex valve (SVV) apparatus has a thin film formed from a superconducting material positioned on a substrate. A receive antenna is positioned on the thin film. A resonant cavity is positioned proximate to the substrate, the thin film, and the receive antenna. A broadcast antenna is in electromagnetic connection with the receive antenna and is positioned proximate to the thin film. A radio frequency (RF) power supply is configured to supply electrical power to the broadcast antenna. A magnetic bias is applied to the thin film in a location proximate to the resonant cavity. The SVV may be embedded within a resonant circuit which may be driven with pulse width modulation (PWM), such as with a resonant circuit driven with PWM which has two PWM-driven resonant circuits in series driven in quadrature.

20 Claims, 7 Drawing Sheets

(56) References Cited

OTHER PUBLICATIONS

"Hybrid inverter integrates distributed energy resources, supports smart grid function ORNL", Jul. 29, 2020, accessed from Oak Ridge National Laboratory website, https://www.ornl.gov/news/hybrid-inverter-integrates-distributed-energy-resources-supports-smart-grid-function, on Oct. 17, 2022, 2 pgs.

Jensen, et al., "A Simple GHz Resonator for Superconducting Materials Characterization", IEEE Transactions on Applied Superconductivity, vol. 25, No. 3, Jun. 2015, pp. 1-4.

Luiz et al., "Negative Resistance Switch Using a SNS Junction", IEEE Transactions on Applied Superconductivity, vol. 3, No. 1, Mar. 1993, pp. 2714-2715.

Oak Ridge National Laboratory website page, https://csabg.org/contact_info/oak_ridge_national_laboratory/, accessed Oct. 17, 2022, 2 pgs.

Osamura, et al., "Prototype of SC Inverter", IEEE Transactions on Applied Superconductivity, vol. 21, No. 3, Jun. 2011, pp. 1445-1448.

Shaternik, et al., "Novel Superconducting Switching Device for Microwave Applications", MSMW 2001 Symposium Proceedings, Kharkov, Ukraine, Jun. 4-9, 2001, pp. 366-368.

\* cited by examiner

POWER ELECTRONICS USING SUPERCONDUCTIVE VORTEX VALVE SWITCHES

FIELD OF THE DISCLOSURE

The present disclosure is generally related to electrical switches and more particularly is related to power electronics using superconductive vortex valve switches.

BACKGROUND OF THE DISCLOSURE

Superconductors are useful in electronics and electrical devices since they provide the ability to transport electric charges without resistance. The specific use of superconductive materials in electrical switches has been previously studied, such as with the use of a cryotron. A cryotron is a superconducting device that switches from the zero-resistance state to the resistive state under the application of magnetic field. Cryotrons have been used extensively in the design of amplifiers, oscillators and various other computer logic circuits, and paired cryotrons have been proposed to create power electronics equipment. More recently, cryotrons have been utilized in an arrangement with a resonator coupled to a dielectric slab to produce an antenna-coupled cryotron (ACC). While ACCs are known in the industry, their performance in practical settings is limited, and therefore further improvements and refinements are needed.

Thus, a heretofore unaddressed need exists in the industry to address the aforementioned deficiencies and inadequacies.

SUMMARY OF THE DISCLOSURE

Embodiments of the present disclosure provide a superconductive vortex valve apparatus. Briefly described, in architecture, one embodiment of the apparatus, among others, can be implemented as follows. A superconductive vortex valve (SVV) has a thin film formed from a superconducting material positioned on a substrate. A receive antenna is positioned on the thin film. A resonant cavity is positioned proximate to the substrate, the thin film, and the receive antenna. A broadcast antenna is in electromagnetic connection with the receive antenna, wherein the broadcast antenna is positioned proximate to the thin film. A radio frequency (RF) power supply is configured to supply electrical power to the broadcast antenna. A magnetic bias is applied to the thin film of the SVV in a location proximate to the resonant cavity.

The present disclosure can also be viewed as providing a superconductive vortex valve apparatus. Briefly described, in architecture, one embodiment of the apparatus, among others, can be implemented as follows. A superconductive vortex valve (SVV) has a thin film formed from a superconducting material positioned on a substrate. A receive antenna is positioned on the thin film. A resonant cavity is positioned proximate to the substrate, the thin film, and the receive antenna. A broadcast antenna is in electromagnetic connection with the receive antenna, wherein the broadcast antenna is positioned proximate to the thin film. A radio frequency (RF) power supply is configured to supply electrical power to the broadcast antenna. A magnetic bias is applied to the thin film of the SVV in a location proximate to the resonant cavity. The SVV is embedded in a resonant circuit driven with pulse width modulation (PWM).

The present disclosure can also be viewed as providing methods of operating a superconductive vortex valve apparatus. In this regard, one embodiment of such a method, among others, can be broadly summarized by the following steps: providing a superconductive vortex valve (SVV) having: a thin film formed from a superconducting material positioned on a substrate; a receive antenna positioned on the thin film; a resonant cavity positioned proximate to the substrate, the thin film, and the receive antenna; a broadcast antenna in electromagnetic connection with the receive antenna, wherein the broadcast antenna is positioned proximate to the thin film; and a radio frequency (RF) power supply configured to supply electrical power to the broadcast antenna. A magnetic bias is applied to the thin film of the SVV in a location proximate to the resonant cavity. The RF power supply is activated to actuate the SVV between an on state and an off state.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

To improve upon the use of superconductive materials in electrical transmission and electronics, the subject disclosure is directed to superconductive switches and more specifically, superconductive vortex valve (SVV) switches which may provide substantial benefits in power electronics, namely, power electronics used for electrical power transmission and distribution systems. It is well-recognized that improved power electronics will play a crucial role in updating the electrical grid currently in use. Currently, silicon-based power electronics used in utility application, including gate turn-off thyristors and insulated-gate bipolar transistors (IGBTs), withstand blocking voltages of 10 kV, with switching speeds at high power in the 100's of Hz. Next-generation requirements lay in the range of 10-100 kV and 20 kHz, with currents above 1 kA.

Various programs have been proposed to help guide the development of next-generation power switching devices that could dramatically improve energy efficiency. One such program proposed by the Advanced Research Projects Agency-Energy (ARPA-E) is entitled "Strategies for Wide-Bandgap, Inexpensive Transistors for Controlling High-Efficiency Systems" (SWITCHES). The technical goal of the ambitious ARPA-E SWITCHES program, necessary to advance the deployment of next-generation power electronics on the grid, is to demonstrate a single switch with a blocking voltage of 1200 V at a current of 100 A. Wide-bandgap semiconductor materials, including silicon carbide and gallium nitride, are the principal development focus. However, these are challenging materials systems, and therefore raise issues which will need to be addressed accordingly.

While these semiconductor materials may present complications towards achieving the goals of ARPA-E SWITCHES, other solutions may exist. One solution is the use of superconductive materials. Superconductivity may be beneficial towards achieving these goals for a number of reasons. For one, the transition between the superconducting and normally-conducting states in a superconducting material is among the most abrupt changes found in nature. Because there is no depletion capacitance, the suitability for high frequency switching is very great. The transition may be actuated through the combined action of at least four separate means: temperature, magnetic field, current, or irradiation with radio frequency (RF) energy. Secondly, superconducting materials support current densities orders of magnitude higher than ordinary materials. For instance, the critical current density of high-temperature superconducting yttrium barium copper oxide (YBCO) with a low level of crystal boundary misalignment is nearly 1 million Amps/cm2. Therefore, a microfabricated superconducting line 1 cm wide by one micron thick can easily support a current in excess of 100 Amps.

Figure 1:
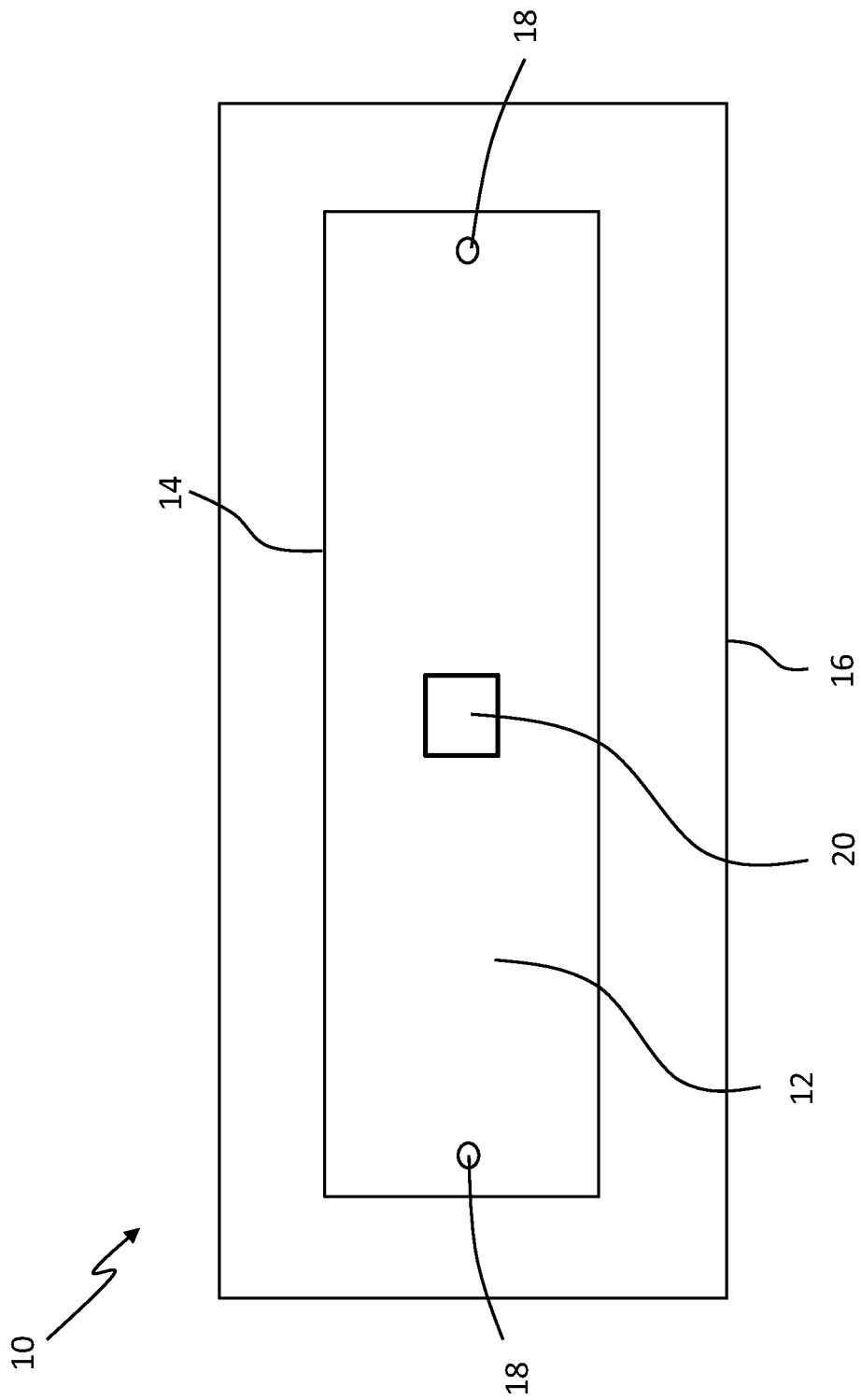
FIG. 1 is a top view illustration of components of a superconductive vortex valve apparatus, in accordance with exemplary embodiments of the present disclosure.

The novel technologies described herein are designed to take advantage of these benefits of superconductive materials and further build upon their possible use as next-generation power switching devices that can improve energy efficiency. To this end, FIG. 1 is a top view illustration of components of a SVV apparatus 10, hereinafter, 'apparatus 10', in accordance with exemplary embodiments of the present disclosure. In particular, FIG. 1 illustrates the foundational structure on which the SVV may be constructed. As shown, a thin film 12 is positioned on a substrate 14. The thin film 12 may be formed from various superconducting materials, such as, for example, either or both low-temperature superconducting materials, e.g., niobium, Tc=9.2 K, and/or high temperature superconducting materials, e.g., YBCO, Tc=92 K. Other materials which are known to have superconducting properties may also be used.

The substrate 14 may have a size and dimension which is able to support currents in the range of 1-100 Amps, or above, at cryogenic temperature, either 4.2K or 77K, material dependent. The substrate 14 may be cut from a wafer, possessing a rectangular shape, such that the substrate 14 is rectangular, as depicted in FIG. 1. The size of the substrate 14 may be selected based on the size of the thin film 12. While the superconducting thin film may have various dimensions, in one example, dimensions of the thin film 12 may be on the order of 1 micron thick, 10 mm wide, and around 20 mm long, such that the substrate has a dimension which is similar. The substrate 14 may be supported by a metal fixture 16 or support structure, which may allow for additional components included in or used with the apparatus 10 to be aligned and held in the correct or desired position.

As depicted in FIG. 1, the thin film 12 may be contacted on edges or ends thereof with one or more contact points 18, which allow the thin film 12 to be contacted by wires or probes for current biasing. The contact points may be made with either ordinary metallic wiring or with flexible superconducting wiring, or another similar material.

The thin film 12 may be patterned with an antenna structure 20 to provide coupling to radio-frequency (RF) energy. The antenna structure 20 may be referred to herein as a 'receive' antenna 20 due to its use in receiving RF energy. In one example, the receive antenna 20 may include a reciprocal patch etched into the thin film 12. In another example, the receive antenna 20 may include a more complex structure incorporating a patch and a waveguide probe.

Figure 2:
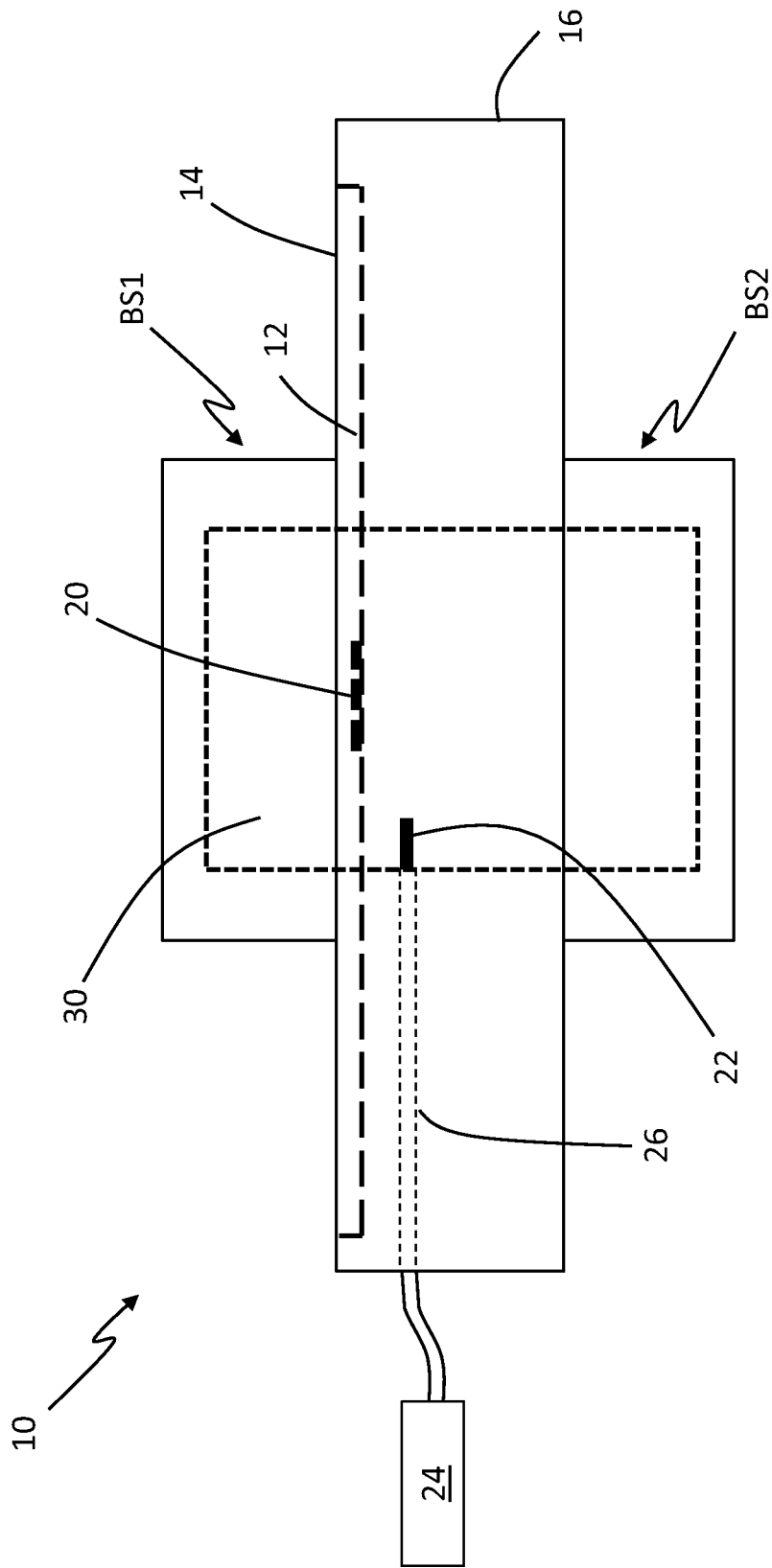
FIG. 2 is a side view illustration of components of a superconductive vortex valve apparatus, in accordance with exemplary embodiments of the present disclosure.

FIG. 2 is a side view illustration of components of a superconductive vortex valve apparatus 10, in accordance with exemplary embodiments of the present disclosure. As shown, the apparatus 10 is depicted with the receive antenna 20, the thin film 12, the substrate 14, and the metal fixture 16. A resonant cavity 30 is positioned proximate to the substrate 14, the thin film 12, and the receive antenna 20. The resonant cavity 30 is designed for operation at RFs and is excited or activated by a broadcast antenna 22, which is in electromagnetic connection with the receive antenna 20. The resonant cavity 30 may be positioned substantially proximate to the receive antenna 20, where the resonant cavity 30 has a continuous cavity in the direction perpendicular to the substrate 14 and the thin film 12 positioned thereon, where the substrate 14 penetrates the resonant cavity 30. As shown in FIG. 2, the thin film 12, substrate 14, and metal fixture 16 may be positioned extending across the resonant cavity 30, such that the receive antenna 20 is positioned adjacent to the resonant cavity 30. The broadcast antenna 22, resonant cavity 30, and receive antenna 20 are jointly designed to couple energy from an external RF power supply 24 and impose a surface current on the thin film 12.

In one example, the resonant cavity 30 is configured as an evanescent mode cavity resonator which is excited by broadcast antenna 22 configured with a coaxial sleeve monopole design, such that the broadcast antenna 22 is a coaxial monopole antenna. In this arrangement, the broadcast antenna 22 may be in electromagnetic connection with the RF power supply 24 such as through one or more physical or non-physical electrical connections 26 which are positioned on or through the substrate 14 or the metal fixture 16, or through a non-physical electromagnetic connection. Other designs of the broadcast antenna 22 are possible, including embedding the entire substrate 14 supporting the superconducting thin film 12 inside a resonant cavity 30 with a broadcast antenna 22 of a different design. An evanescent mode cavity resonator is resonant at all frequencies below cutoff, and as such, it may be relatively insensitive to the frequency of operation. The operating frequency may instead mostly be determined by the embedding impedance of the broadcast antenna 22. The resonant cavity 30 is designed to resonate in the range of 2-20 GHz, but higher frequencies are also contemplated, depending on the design of the apparatus 10.

As illustrated in FIG. 2, the resonant cavity 30 may be split into two sections which are aligned above and below the receive antenna 20, where the resonant cavity 30 has a continuous cavity in the direction perpendicular to the substrate 14. These two sections of the resonant cavity are referred to as "BS1" and "BS2" which are representative of the term 'backshort' as used in microwave engineering. These two sections BS1, BS2 of the resonant cavity 30 may be attached to the substrate 14 or the metal fixture 16, or both. The use of various attachment devices and structures may be used to provide this attachment. For instance, in one example, there may be one or more holes which allow for alignment of sections BS1 and BS2 with the substrate 14 or metal fixture 16.

The RF power supply 24 may be used to supply RF power to the broadcast antenna 22. In one example, the RF power supply 24 may be an external supply, such as one based upon a magnetron, traveling-wave tube, or solid-state device, among other possibilities. In another example, the RF power supply 24 may be integrated on the substrate 14 or metal fixture 16 with the superconducting thin film 12, where it can be actuated with a DC bias line. It is noted that the RF power supply 24 is not intended for continuous operation. It is instead intended to actuate the SVV portion of the apparatus 10 between an on state and an off state, or on and off modes, very quickly for brief intervals, for instance, of the order of 1 microsecond duration.

Figure 3:
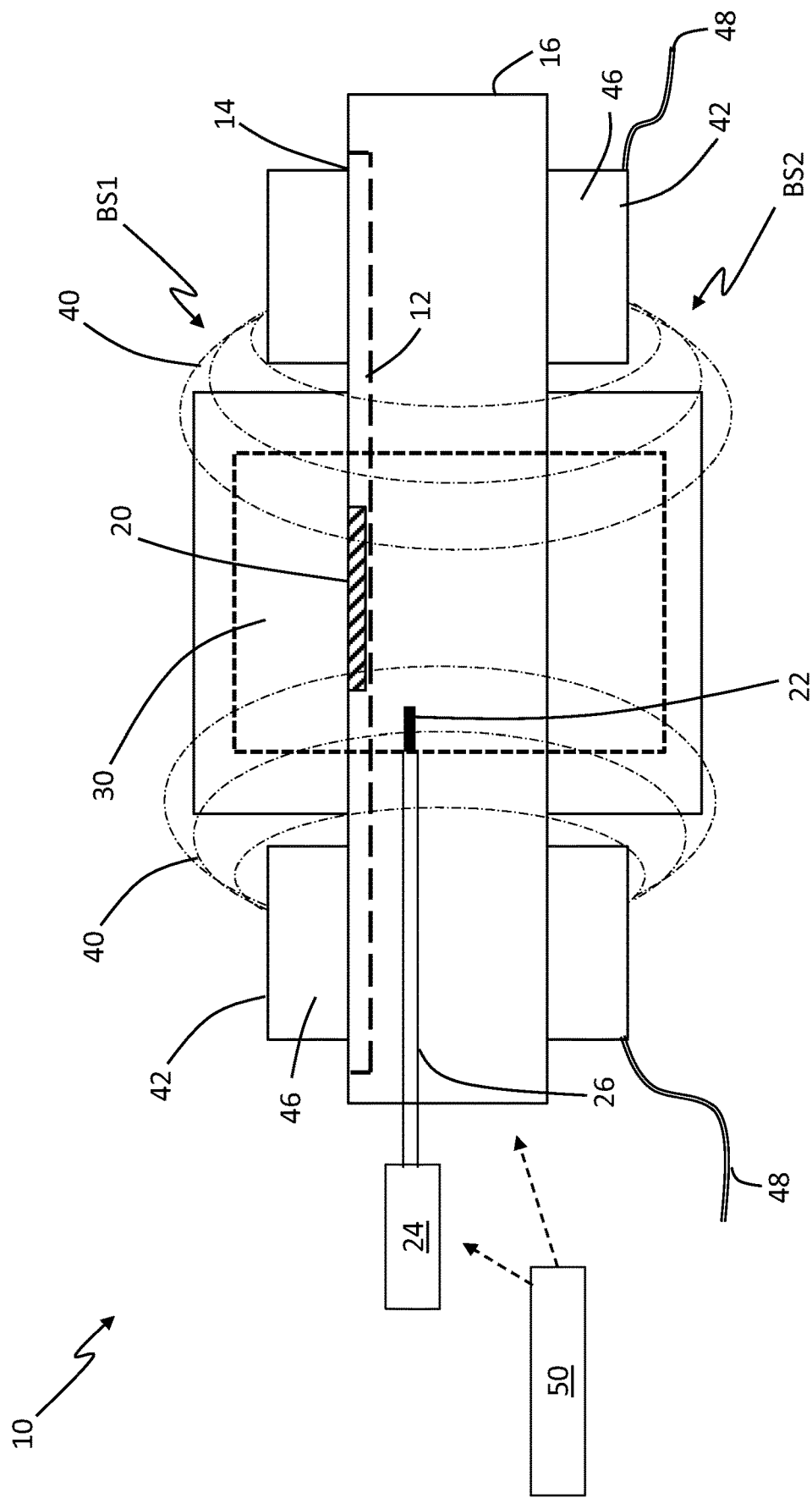
FIG. 3 is a side view illustration of a superconductive vortex valve apparatus with active magnetic bias application, in accordance with exemplary embodiments of the present disclosure.
Figure 4:
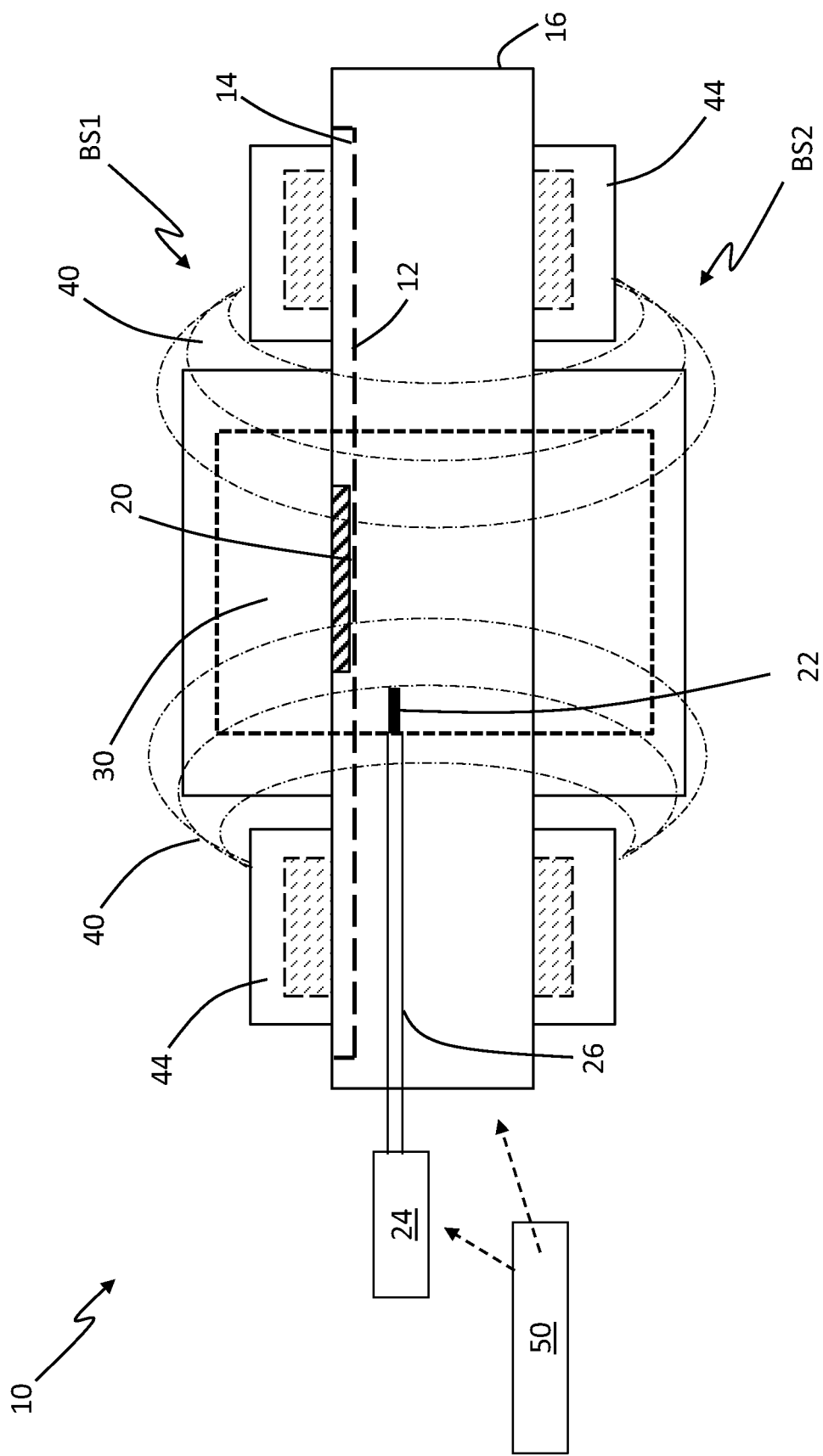
FIG. 4 is a side view illustration of a superconductive vortex valve apparatus with magnetic bias application from permanent magnets, in accordance with exemplary embodiments of the present disclosure.

Turning next to FIGS. 3-4, FIG. 3 is a side view illustration of a superconductive vortex valve apparatus 10 with active magnetic bias application and FIG. 4 is a side view illustration of a superconductive vortex valve apparatus 10 with magnetic bias application from permanent magnets, in accordance with exemplary embodiments of the present disclosure. Both FIGS. 3-4 illustrate the apparatus 10 with the SVV in use with a magnetic bias 40 (illustrated in dot-dash broken lines), where that magnetic bias 40 is the biasing magnetic field which is derived from a magnetic fixture. The magnetic bias 40 may allow the apparatus 10 to operate as intended. In FIG. 3, the magnetic fixture is an active magnet 42 that generates a magnetic force through the use of a coil and an electrical current. The active magnet 42 in FIG. 3 may be a solenoid or similar active magnet device or structure, all of which are considered within the scope of the present disclosure, which uses coils or windings 46 of wire through which an electric current is passed, such as a current received from a power source line 48. The windings 46 of the active magnet 42 may be formed from copper or other common wire materials, or they may be formed from low-temperature or high temperature superconducting materials. In FIG. 4, the magnetic fixture is a permanent magnet 44 that emits a constant magnetic force. The active magnet 42 or permanent magnet 44, as the case may be, may be positioned surrounding the metal fixture 16 and the substrate 14, or a portion thereof, such as where the active magnet 42 or permanent magnet 44 are positioned on substantially opposing sides of the metal fixture 16 and substrate 14 with the resonant cavity 30 in the middle thereof.

The apparatus 10 effectively operates like a valve, as one might understand operation of a valve in a fluid mechanics context. For instance, when the apparatus 10 is under the condition of constant current flow, activating the apparatus creates a voltage across it, analogous to the situation in a closed hydraulic circuit with a pump under the condition of constant flow when a valve is throttled, where the apparatus 10 does not transition to the normal state. When zero signal is applied to the apparatus 10, the superconducting thin film 12 conducts large currents at zero voltage (by analogy to fluid mechanics, the valve is open). When RF energy is applied from the broadcast antenna 22, however, the motion of superconducting vortices at the nanoscale generates a spatially inhomogeneous distribution of quasiparticles, creating a voltage (by analogy to fluid mechanics, the valve is shut). The use of magnetic field biasing 40 with the SVV improves over the conventional use of an antenna-coupled cryotron (ACC) switches, since the SVV will exhibit fast switching, often at levels below 1 microsecond, at high currents, such as between 10-100 Amps or more, and at reasonable voltages above 1 Volt. These parameters are not achievable by conventional ACCs.

This operation of the apparatus 10 is based on various fundamental understandings. First, when a magnetic field penetrates a Type II superconductor, it does so in quantized flux bundles known as normal vortex cores. This creates a mixed state in which superconducting and normally conducting phases coexist. The apparatus 10 exploits the mixed state, and necessarily operates under magnetic bias 40 to increase the areal density of vortex cores, and correspondingly the output voltage. Second, the normal state vortex cores exist in a motionless lattice under conditions of low applied magnetic field and low current. In this case, the vortex lattice is said to be "pinned". The vortices begin to move, in the direction perpendicular to both the current and the applied field, when the "pinning force" is exceeded. The motion of the vortex lattice causes a small voltage to appear, in the direction of current flow. Third, quasiparticles are charge carriers existing in superconductors at temperatures above T=0. Both quasi-electrons and quasi-holes exist. A useful voltage may be extracted from the apparatus 10 due to a disequilibrium between the quasi-electron and quasi-hole populations surrounding each normal state vortex core under operating conditions.

The voltage output by the apparatus 10 increases approximately as the areal density of the number of normal vortex cores penetrating the superconducting thin film. Because each vortex core carries one flux quantum, it follows that the voltage output increases approximately as SQRT(B), where B represents the applied magnetic field of the magnetic bias 40. The apparatus 10 may operate under a condition of constant or slowly-varying magnetic field. It is noted that the apparatus 10 is not magnetically actuated, which is different than the typical design of a superconducting cryotron. Rather, the apparatus 10 is actuated by the application of RF power.

It is further noted that the apparatus 10 may utilize various control devices or related control techniques, such as the use of computerized control. In FIGS. 3-4, the apparatus 10 is illustrated with optional communication with a control system 50 which can be used to provide control signals to the apparatus 10, to the SVV, or to specific components of the apparatus 10, such as the RF power signal 24. All known control devices, systems, and techniques may be utilized by the control system 50.

Figure 5:
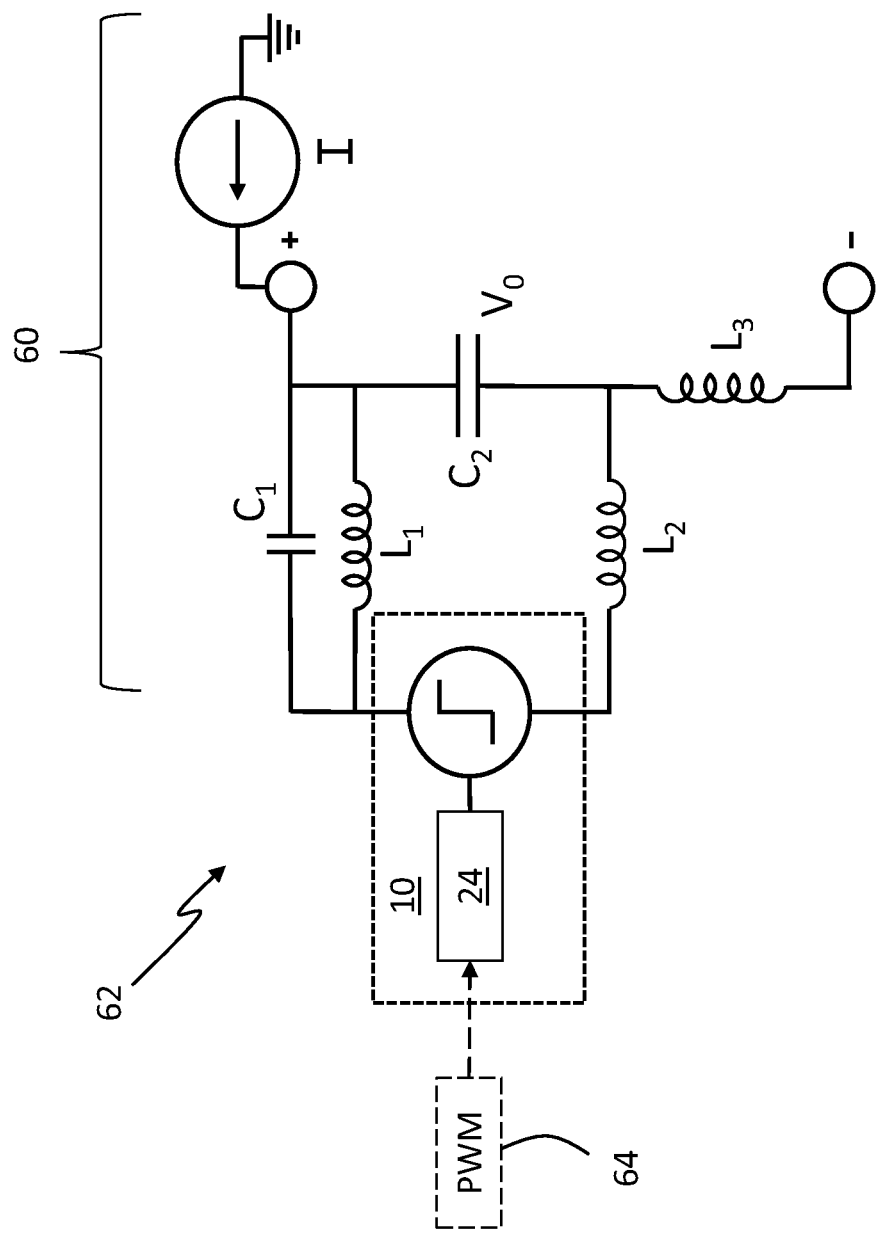
FIG. 5 is a circuit diagram of a superconductive vortex valve of a superconductive vortex valve apparatus embedded in a resonant circuit, in accordance with exemplary embodiments of the present disclosure.

FIG. 5 is a circuit diagram of a superconductive vortex valve of a superconductive vortex valve apparatus 10 embedded in a resonant circuit 60, in accordance with exemplary embodiments of the present disclosure. In FIG. 5, the SVV described relative to FIGS. 1-4 is depicted incorporated or embedded within a resonant circuit 60, thereby forming a so-called embedding circuit 62. It is well-understood that the foundational element for a power electronics device is a switch. In order to create an SVV-based switch, the SVV is embedded in a resonant circuit 60 constructed from lossless elements, e.g., capacitors and inductors. FIG. 5 illustrates one example of a SVV-embedded resonant circuit 62. It is noted that the embedding circuit 62 may be held at room temperature, separate from the SVV apparatus 10, or may be cryogenically cooled, in proximity to the SVV apparatus 10, all such options are within the scope of the present disclosure. The intention of the embedding circuit 62 is to actuate the apparatus 10 at a high frequency near the natural resonances of the embedding circuit 62, approximately in the range of 10 MHz or above. In this manner, a high voltage may be obtained from the embedding circuit 62, based upon the speed of actuation of the apparatus 10. A high voltage is not required from the apparatus 10 itself.

The general principle of operation can be understood using elementary transient analysis of the embedding circuit 62, as depicted in FIG. 5. In this example, under steady-state conditions, capacitors become open circuits, and inductors become short circuits. For fast transients, the situation is reversed: capacitors are replaced by short circuits, and inductors become open. Using the principles of transient analysis, for steady state, the path Vo-L1-SVV-L2-L3 is perfectly conducting. Therefore, when there is no RF power applied to the apparatus 10 in the embedding circuit 62, the embedding circuit is in the ON condition or in the ON position and conducts the current I with zero loss. When the apparatus 10 is quickly actuated by applying a current from the RF power supply, however, even though C1 and C2 are shorted, L3 sustains a high voltage with zero conduction. The operation is similar to that of a switch in the OFF position. Accordingly, embedding the apparatus 10 within a resonant circuit 60 can allow the apparatus 10 to operate in a switching capacity in this manner.

It is noted that the resonant circuit 60 of FIG. 5 illustrates one example of the structure of the embedding circuitry 62 and that other structures are possible, including those that utilize other or additional components in various configuration.

It is further noted that the application of pulse-width modulation strategies may be beneficial to the apparatus 10, thereby allowing it to serve as a building block for compact, lightweight, and agile utility-scale power electronics. With continued reference to FIG. 5, a pulse with modulation (PWM) module 64 may be used to conduct PWM of the RF power supply 24, which can be used to drive the apparatus 10 in such a way as to obtain the desired output voltage. The embedding circuit 62 is resonant, however, so it is unlikely a high DC output voltage (in the term of art, a "blocking voltage") can be obtained by the use of PWM alone. Rather, the use of the PWM module 64 is to drive the embedding circuit 62 when not fully conducting to follow the oscillatory behavior described in the following equation:

$$v_0 = V \cdot \sin^2(2\pi f t)$$

where $v_0$ represents a voltage output across the circuit, V represents the amplitude of the response generated by the resonant circuit to the step impulse input, t represents time, and f represents the frequency of oscillation, which is chosen near the natural frequency of the resonant circuit 60. The components L1, C1, L2, C2, and L3 of the embedding circuit 62 may be chosen with this requirement in mind.

The overall embedding circuit 62 with PWM control may operate concurrently at three separate frequencies: (1) the frequency of the RF power supply 24, from 2-20 GHz, with operation at 2.45 GHz being likely ideal; (2) the switching frequency of the SVV apparatus 10 and the resonant frequencies of the embedding circuit 62, e.g., ideally in the range from 1 to approximately 100 MHz; and (3) the switching frequency ON-OFF-ON of the high-current switch, as dictated by the requirements of the power electronics application. This frequency may ideally fall within the range of 1 kHz or less. Of course, other ranges may be possible, depending on the design of the apparatus 10 or embedding circuit 62, or a particular intended use.

Figure 6:
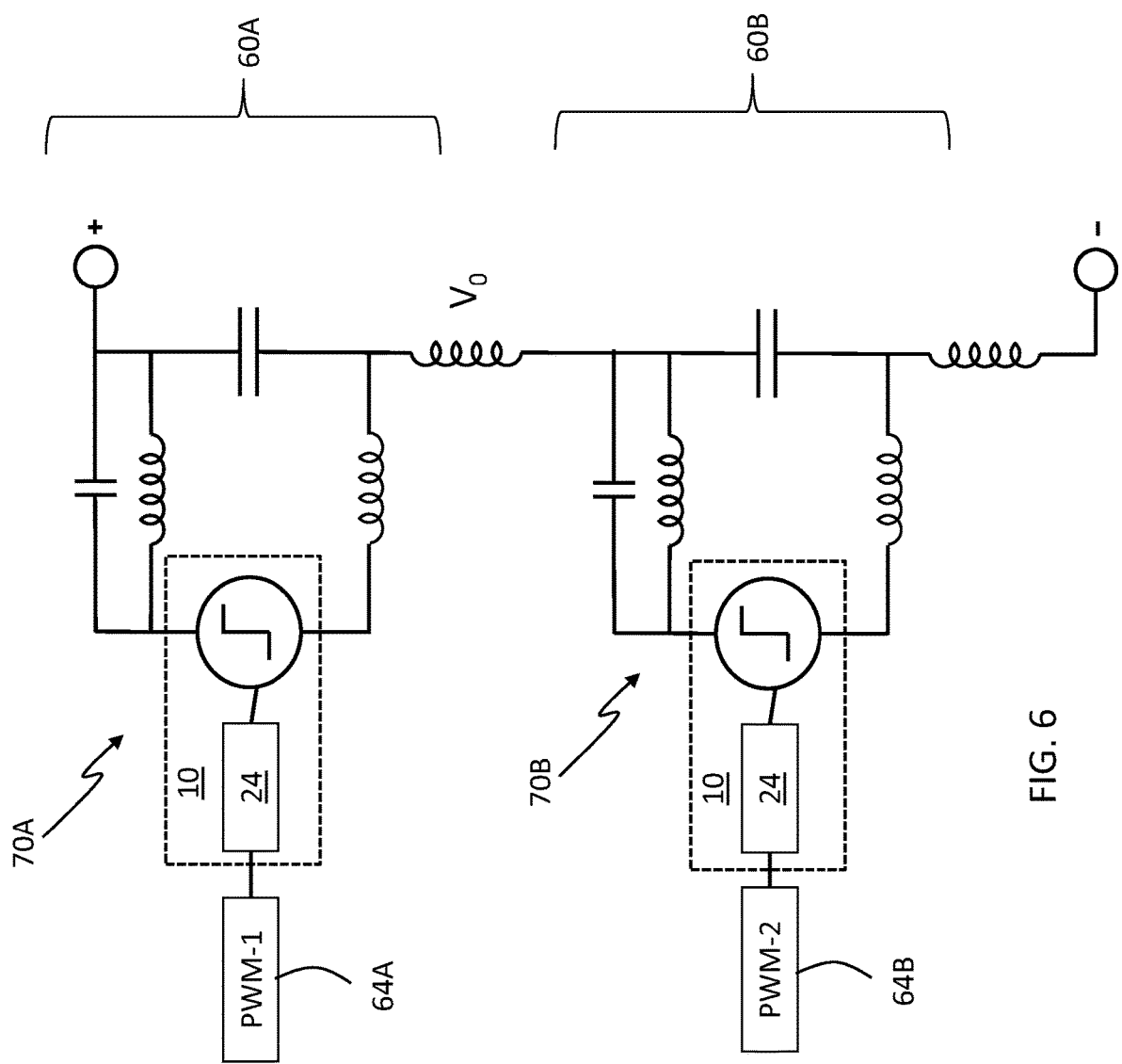
FIG. 6 is a circuit diagram of a superconductive vortex valve of a superconductive vortex valve apparatus embedded in a PWM-driven resonant circuit driven in quadrature, in accordance with exemplary embodiments of the present disclosure.

FIG. 6 is a circuit diagram of a superconductive vortex valve of a superconductive vortex valve apparatus 10 embedded in PWM-driven resonant circuits 70A, 70B driven in quadrature, in accordance with exemplary embodiments of the present disclosure. In particular, FIG. 6 illustrates an example where PWM can be used to further improve operation of the apparatus 10 in an embedding circuit where first and second resonant circuits 60A, 60B are driven by first and second PWM modules 64A, 64B, and are in series. As shown, the PWM-driven resonant circuits 70A, 70B each incorporate the SVV apparatus 10 as a single component in the circuit which operates as an agile switch with a high blocking voltage. The switch is achieved by placing two PWM-driven resonant circuits 70A, 70B in series, however, driven 90 degrees out of phase with one another. This is known as the PWM-driven resonant circuits 70A, 70B being driven in quadrature. The total output voltage across these two in-series circuits 70A, 70B is described by the following equation:

$$v_0 = V \cdot \sin^2(2\pi f t) + V \cdot \cos^2(2\pi f t)$$

where $v_0$ represents a voltage output across the series, V represents the amplitude of the response generated by the resonant circuit to the step impulse input, t represents time, and f represents the frequency of oscillation, where the use of trigonometry shows an output of DC voltage of V volts.

Figure 7:
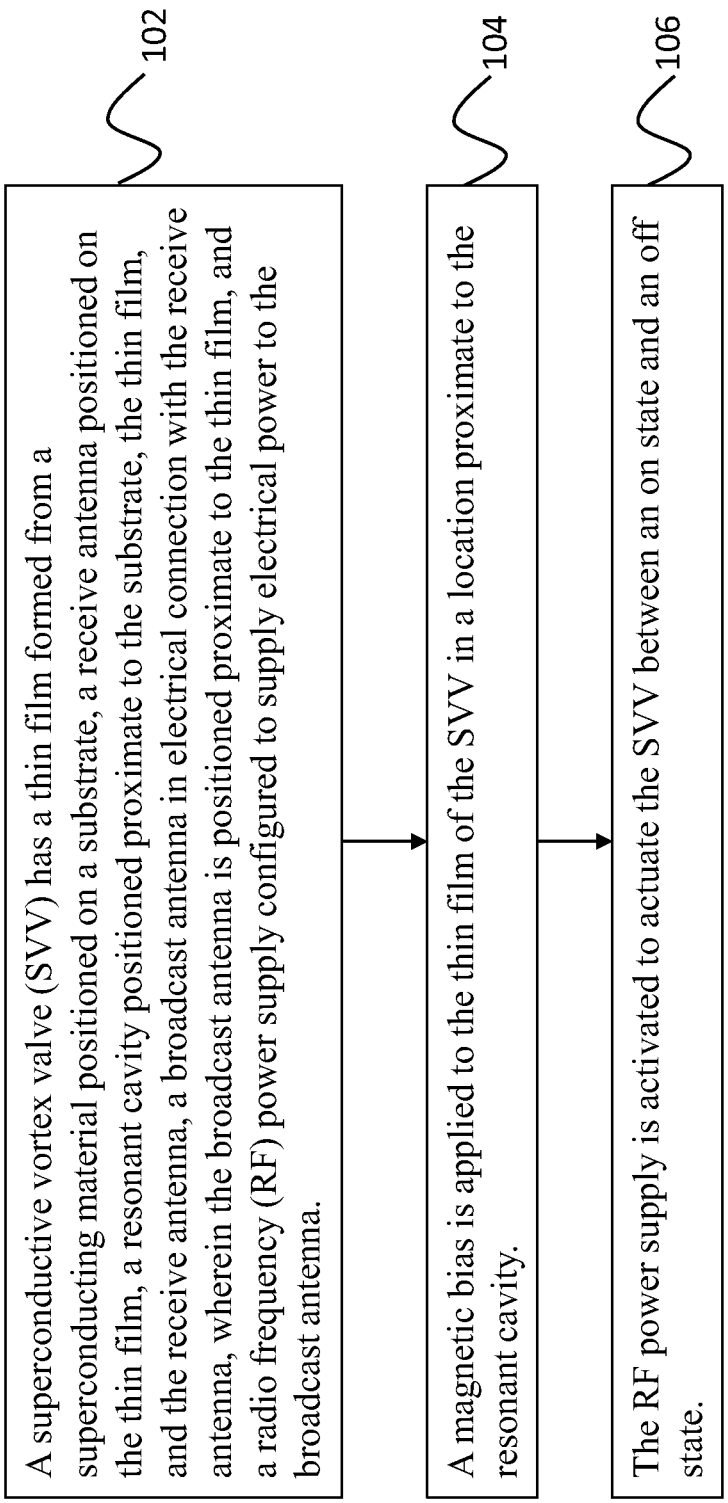
FIG. 7 is a flowchart illustrating a method of operating a superconductive vortex valve apparatus, in accordance with exemplary embodiments of the present disclosure.

FIG. 7 is a flowchart 100 illustrating a method of operating a superconductive vortex valve apparatus 10, in accordance with exemplary embodiments of the disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 102, a superconductive vortex valve (SVV) has a thin film formed from a superconducting material positioned on a substrate, a receive antenna positioned on the thin film, a resonant cavity positioned proximate to the substrate, the thin film, and the receive antenna, a broadcast antenna in electromagnetic connection with the receive antenna, wherein the broadcast antenna is positioned proximate to the thin film, and a radio frequency (RF) power supply configured to supply electrical power to the broadcast antenna. A magnetic bias is applied to the thin film of the SVV in a location proximate to the resonant cavity (block 104). The RF power supply is activated to actuate the SVV between an on state and an off state (block 106). Any number of additional steps, functions, processes, or variants thereof may be included in the method, including any disclosed relative to any other figure of this disclosure.

As described herein, the apparatus 10 and associated methods of operation can provide improvements to power switching, especially with power electronics. This technology can serve as the building block for compact, lightweight, and agile utility-scale power electronics. The technology will benefit the utility industry by increasing the capabilities and flexibility of equipment deployed on the grid while reducing its cost, size, and weight. Reducing the size and weight, in particular, may be of particular benefit to manufacturers of wind turbines, since the size and weight of components is often a key consideration to their inclusion in such systems.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A superconductive vortex valve apparatus comprising:
   a thin film formed from a superconducting material positioned on a substrate;
   a receive antenna positioned on the thin film;
   a resonant cavity positioned proximate to the substrate, the thin film, and the receive antenna;
   a broadcast antenna in electromagnetic connection with the receive antenna, wherein the broadcast antenna is positioned proximate to the thin film; and
   a radio frequency (RF) power supply configured to supply electrical power to the broadcast antenna; and
   a magnetic bias applied to the thin film in a location proximate to the resonant cavity.

2. The superconductive vortex valve apparatus of claim 1, wherein the magnetic bias increases an areal density of vortex cores in the thin film, to thereby increase a voltage output.

3. The superconductive vortex valve apparatus of claim 2, wherein the voltage output increases as the areal density of a number of normal vortex cores penetrating the superconducting thin film increases.

4. The superconductive vortex valve apparatus of claim 1, wherein the magnetic bias is generated with a permanent magnet.

5. The superconductive vortex valve apparatus of claim 1, wherein the magnetic bias is generated by applying a current to a magnetic winding.

6. The superconductive vortex valve apparatus of claim 5, wherein the magnetic winding is formed from at least one of: copper, low-temperature superconducting wire, or high-temperature superconducting wire.

7. The superconductive vortex valve apparatus of claim 1, wherein application of the magnetic bias is at least one of: constantly or slowly-varying.

8. The superconductive vortex valve apparatus of claim 1, further comprising a resonant circuit, wherein thin film, the substrate, the receive antenna, the resonant cavity, the broadcast antenna, and the RF power supply are embedded in the resonant circuit.

9. The superconductive vortex valve apparatus of claim 8, wherein the SVV apparatus is actuated at a frequency range near a natural resonance of the resonant circuit.

10. The superconductive vortex valve apparatus of claim 1, further comprising a pulse width modulation (PWM) module, wherein PWM is applied to the RF power supply.

11. A superconductive vortex valve apparatus comprising:
    a superconductive vortex valve (SVV) having:
       a thin film formed from a superconducting material positioned on a substrate;
       a receive antenna positioned on the thin film;
       a resonant cavity positioned proximate to the substrate, the thin film, and the receive antenna;
       a broadcast antenna in electromagnetic connection with the receive antenna, wherein the broadcast antenna is positioned proximate to the thin film; and
       a radio frequency (RF) power supply configured to supply electrical power to the broadcast antenna;
    a magnetic bias applied to the thin film of the SVV in a location proximate to the resonant cavity; and
    a resonant circuit driven with pulse width modulation (PWM), wherein the SVV is embedded in PWM-driven resonant circuit.

12. The superconductive vortex valve apparatus of claim 11, wherein the PWM-driven resonant circuit comprises two PWM-driven resonant circuits driven in quadrature.

13. A method of operating a superconductive vortex valve apparatus, the method comprising:
    providing a superconductive vortex valve (SVV) having:
       a thin film formed from a superconducting material positioned on a substrate;
       a receive antenna positioned on the thin film;
       a resonant cavity positioned proximate to the substrate, the thin film, and the receive antenna;
       a broadcast antenna in electromagnetic connection with the receive antenna, wherein the broadcast antenna is positioned proximate to the thin film; and
       a radio frequency (RF) power supply configured to supply electrical power to the broadcast antenna;
    applying a magnetic bias to the thin film of the SVV in a location proximate to the resonant cavity; and
    activating the RF power supply to actuate the SVV between an on state and an off state.

14. The method of operating a superconductive vortex valve apparatus of claim 13, wherein the magnetic bias increases an areal density of vortex cores in the thin film, to thereby increase a voltage output of the SVV.

15. The method of operating a superconductive vortex valve apparatus of claim 14, wherein the voltage output of the SVV increases as the areal density of a number of normal vortex cores penetrating the superconducting thin film increases.

16. The method of operating a superconductive vortex valve apparatus of claim 13, further comprising generating the magnetic bias with at least one of: a permanent magnet or by applying a current to a magnetic winding.

17. The method of operating a superconductive vortex valve apparatus of claim 13, wherein the magnetic bias is applied by at least one of: constantly or slowly-varying.

18. The method of operating a superconductive vortex valve apparatus of claim 13, further comprising embedding the SVV in a resonant circuit.

19. The method of operating a superconductive vortex valve apparatus of claim 13, further comprising driving the resonant circuit with pulse width modulation (PWM) applied to the RF power supply.

20. The method of operating a superconductive vortex valve apparatus of claim 19, wherein the resonant circuit driven with PWM comprises two PWM-driven resonant circuits driven in quadrature.

* * * * *